US006223333B1

(12) United States Patent
Kuribayashi et al.

(10) Patent No.: US 6,223,333 B1
(45) Date of Patent: Apr. 24, 2001

(54) PATTERN MATCHING METHOD, TIMING ANALYSIS METHOD AND TIMING ANALYSIS DEVICE

(75) Inventors: Mototaka Kuribayashi; Hideki Takeuchi; Junichi Tsujimoto, all of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 08/882,495

(22) Filed: Jun. 25, 1997

(30) Foreign Application Priority Data

Jun. 28, 1996 (JP) ...................................................... 8-170064

(51) Int. Cl.⁷ .................................................... G06F 17/50
(52) U.S. Cl. .................................. 716/12; 716/5; 716/10
(58) Field of Search ..................................... 364/488, 489, 364/490, 491; 716/5

(56) References Cited

U.S. PATENT DOCUMENTS

| 5,384,718 | * | 1/1995 | Miyaoka | 716/12 |
| 5,519,627 | * | 5/1996 | Mahmood | 364/488 |
| 5,726,902 | * | 3/1998 | Mahmod | 716/12 |
| 5,812,417 | * | 9/1998 | Young | 364/491 |
| 5,920,489 | * | 7/1999 | Dibrino | 395/500.03 |

\* cited by examiner

*Primary Examiner*—Matthew Smith
*Assistant Examiner*—Thuan Do
(74) *Attorney, Agent, or Firm*—Foley & Lardner

(57) ABSTRACT

In the timing analysis method, connection information is compared to circuit patterns that have been stored in a memory in advance after reading the connection information of an electrical circuit, a connection information supplement process to supplement vertically circuit connection information regarding the matched circuit pattern for the stored connection information is performed when the connection information is matched with one of the registered circuit patterns, and a timing analysis of the connection information that has been supplemented by the connection information supplement process is executed.

10 Claims, 9 Drawing Sheets

| ELEMENTS | DRAIN NODE | GATE NODE | SOURCE NODE | | | | |
|---|---|---|---|---|---|---|---|
| MTrA | Z | A | VDD | VDD | PD=$x_1$ | PS=$y_1$ | AD=$z_1$ ... |
| MTrB | Z | A | VSS | VSS | PD=$x_2$ | PS=$y_2$ | AD=$z_2$ ... |

US 6,223,333 B1

PATTERN MATCHING METHOD, TIMING ANALYSIS METHOD AND TIMING ANALYSIS DEVICE

BACKGROUND OF THE INVENTION

1. Field of the Invention

The present invention relates to a pattern matching method for matching input information such as circuit connection information and the like with predetermined patterns which have already been prepared and registered, a timing analysis method for performing the timing analysis of semiconductor integrated circuits by using the pattern matching method, and a timing analysis device for executing the timing analysis method.

2. Description of the Related Art

In general, the functions of a semiconductor integrated circuit to be designed are divided into a hierarchical structure having a plurality of hierarchical phases and the design for the semiconductor integrated circuit is executed in each hierarchical phase in circuit design because it is difficult to execute a detailed design of the entire circuit simultaneously. This design method is called to as a hierarchical design method.

FIG. 1 is a diagram showing a microprocessor chip which is designed in a hierarchical structure having a plurality of functional blocks.

As shown in FIG. 1, the microprocessor chip is usually divided into several blocks B1 to B5. In FIG. 1, reference number 1000 designates the microprocessor chip as a semiconductor chip, the reference characters B1 to B5 indicate functional blocks such as a central processing unit (CPU) core block, a control logic block, a ROM, a RAM, and a cache memory.

The hierarchical design of the microprocessor is a method in which these functional blocks B1 to B5 are further divided into small-sized blocks. Finally, the hierarchical design of the microprocessor will reach a transistor design level in which each of transistors is designed. Usually, the hierarchical design of the microprocessor is completed when it reaches a design level where several gates that can be provided by a logical library are designed.

In the hierarchical design of the microprocessor, for example, the design in a chip level, where the plurality of blocks B1 to B5 are included, is executed after the functional block design level (Bottom up design method). Then, the design is executed every hierarchical layer by using software as a simulator.

In addition, the simulation of a timing design for delay will be performed (timing analysis) after the completion of the placement of the blocks and the wiring design process. A timing analysis program is used during this timing analysis process. For example, the longest bus (called to as a critical path) in each block is detected (path analysis) in order to check the timing against the delay including a wiring delay. During this timing analysis, in general, the timing analysis in the chip level is performed after the completion of the timing analysis for the block level.

FIG. 2 is a flow chart showing the process of the path analysis by using a conventional timing analysis.

First, data items of circuit connection information (net lists) are read and stored into a main memory in a simulator (Step S51) in advance.

Following this process, the direction of a signal propagation or a signal transfer of each transistor in the net list is determined (Step S52). Then, the circuit is divided into a plurality of blocks B1, . . . , Bn (Step S53).

The critical path in each block is determined (Steps S54 and S55). Then, the critical paths N (N is a positive integer) in the whole blocks designated by a user are reported to the user (Step S56).

The user refers to the result of the path analysis in order to decide a timing validity of the designed circuit. However, the conventional timing analysis method has the following drawback.

There is a case in which a net list is matched well in the level of the entire semiconductor chip, but it is not matched in a block level. For example, elements in a composition indicating one function are belonged to different blocks. In this case, it is difficult to perform the path analysis process properly.

FIG. 3 is a diagram showing a semiconductor integrated circuit chip including pre-charge bus circuits. FIG. 3 shows a specific example in which the drawback described above is present. In FIG. 3, P-channel MOS transistors 111 to 114 (hereinafter referred to as P-MOS transistors) are formed in the block B1. In the block B2, the N-channel MOS transistors (hereinafter referred to as N-MOS transistors) 121, 122, 123, 124, 125, 126, 127, and 128 are formed. The P-MOS transistor 111 and the N-MOS transistors 121 and 122 are connected in series between the power source VDD and the ground source VSS. Similarly, the P-MOS transistor 112 and the N-MOS transistors 123 and 124 are connected in series between the power source VDD and the ground source VSS, the P-MOS transistor 113 and the N-MOS transistors 125 and 126 are connected in series between the power source VDD and the ground source VSS, and the P-MOS transistor 114 and the N-MOS transistors 127 and 128 are also connected in series between the power source VDD and the ground source VSS.

For example, a clock signal $\phi$ is provided to both the gates of the P-MOS transistor 111 and the N-MOS transistor 121. That is, both gates of the P-MOS transistor 111 and the N-MOS transistor 121 receive the in-phase clock signal $\phi$. The data item D1 is provided to the N-MOS transistor 122, and a bus signal wire 131 is connected to an output node that is connected between the P-MOS transistor 111 and the N-MOS transistor 121. Thus, the set of these components described above forms the function of a circuit.

Similarly, the set of P-MOS transistor 112, the N-MOS transistor 123, N-MOS transistor 124, and the bus wiring 132 forms the function of a circuit. The set of P-MOS transistor 113, the N-MOS transistor 125, N-MOS transistor 126, and the bus wiring 133 forms the function of a circuit. The set of P-MOS transistor 114, the N-MOS transistor 127, N-MOS transistor 128, and the bus wiring 134 forms the function of a circuit.

However, in the case of this circuit described above, the block B1 (for example, such as the CPU core)includes the P-MOS transistors 111 to 114 and the block B2 (for example, such as the control logic) includes N-MOS transistors 121 to 128. In this case, it is difficult to perform a timing analysis for the block B2 because a pair of the pre-charge buses (including the P-MOS transistor 111, the N-MOS transistor 121, the N-MOS transistor 1222, and the bus signal wire 131) is not grouped into one net list.

Thus, it is difficult to execute the timing analysis for a block having imperfect net list. In the prior art, this problem is solved manually by designers. However, the manual operation will cause mistakes and requires more operation time. Therefore the manual operation is not practical.

As described above, it is difficult to perform the timing analysis of a functional circuit in the block level by using the conventional timing analysis when elements in the functional circuit include different blocks even if the elements form the functional circuit such as the pre-charge bus circuit described above.

SUMMARY OF THE INVENTION

Accordingly, an object of the present invention is, with due consideration to the drawbacks of the conventional timing analysis method and the conventional system, to provide a pattern matching method which is capable of increasing the accuracy of timing analysis process by applying the pattern matching method to the timing analysis process. In addition, another object of the present invention is to provide a timing analysis method by which the accuracy of timing analysis operation in block design level can be increased and the supplement operation to supplement circuit connection information can be automatically executed. Furthermore, another object of the present invention is to provide a timing analysis device for executing the timing analysis method.

In accordance with a preferred embodiment of the present invention, a pattern matching method comprises the steps of reading input information and matching the input information with predetermined patterns, and supplementing net lists regarding the predetermined patterns to the input information when there is a data item in the input information that being matched with the predetermined patterns. Thereby, the pattern matching process based on the pattern matching method can be executed easily and the accuracy of the timing analysis process can be increased.

In accordance with another preferred embodiment of the present invention, a timing analysis method comprises the steps of reading connection information of an electrical circuit as a target and matching the connection information with circuit patterns that have been registered in advance, performing a connection information supplement process for supplementing vertically circuit connection information regarding the registered circuit pattern matched with the connection information of the electrical circuit when there is information in the connection information matched with the registered circuit pattern, and performing a timing analysis process for the connection information after completion of the connection information supplement process. Thereby, the pattern matching method is introduces as a pre-processing function. In the pattern matching method, for example, the supplement process of data items of circuit connection information that are lacked in a block design level is executed automatically and vertically. After this supplement process, the timing analysis process is performed. Thereby, it is possible to increase the accuracy of the timing analysis in the block design level and not required to perform the supplement of the circuit connection information by manual.

In the timing analysis method as another preferred embodiment of the present invention, the circuit patterns are circuit patterns that being not analyzed in a predetermined hierarchy by the timing analysis process and the circuit connection information supplemented by the connection information supplement process are connection information of a circuit in a hierarchy other than the predetermined hierarchy. Thereby, it is possible to execute the timing analysis process of the block design level by using the timing analysis method of the present invention when the timing analysis process is performed in hierarchy (It is difficult to perform the timing analysis in hierarchy by using a conventional timing analysis method).

In accordance with another preferred embodiment of the present invention, a timing analysis method further comprises the step of detecting whether or not the connection information matched with the registered circuit patterns is connection information that being no target for the connection information supplement process and being in the predetermined hierarchy, wherein the pattern matching method performs the timing analysis process without executing the connection information supplement process when a detecting result indicates. Thereby, it is possible to supplement accurate circuit connection information corresponding to the timing analysis in the connection information supplement process.

In the timing analysis method as another preferred embodiment of the present invention, the registered circuit patterns are circuit patterns regarding pre-charge bus circuits and circuit connection information is supplemented so that a N-MOS transistor and a P-MOS transistor are grouped into one pair by a same phase clock signal in the connection information supplement process. Thereby, in a circuit part in a pair of the N-MOS transistor and the P-MOS transistor of the pre-charge bus circuit performed by the same-phase clock signal, for example, the lacked circuit connection information can be automatically and vertically supplemented when the P-MOS transistor and the N-MOS transistor are in different blocks.

In accordance with another preferred embodiment of the present invention, a timing analysis device comprises a memory for storing connection information of an electrical circuit, pattern matching means for performing a matching process to match the connection information stored in the memory with predetermined circuit patterns, connection information supplement means for supplementing circuit connection information regarding a circuit pattern matched in the predetermined circuit patterns to the connection information stored in the memory when the connection information stored in the memory is matched with the predetermined circuit patterns, and timing analysis means for performing a timing analysis process for the connection information stored in the memory which has been supplemented by the connection information supplement means. Thereby, the pattern matching device performs based on the pattern matching method introducing as a pre-processing function. In the pattern matching device, for example, the supplement process of data items of circuit connection information that are lacked in a block design level is executed automatically and vertically. After completion of this supplement process, the timing analysis process is performed. Thereby, it is possible to increase the accuracy of the timing analysis in the block design level and not required to perform the supplement of the circuit connection information by manual.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of the present invention will become apparent through the following description of preferred embodiments which are given for illustration of the invention and are not intended to be limiting thereof. Preferred embodiments according to the present invention will now be described with reference to the drawings.

First Embodiment

Figure 4:
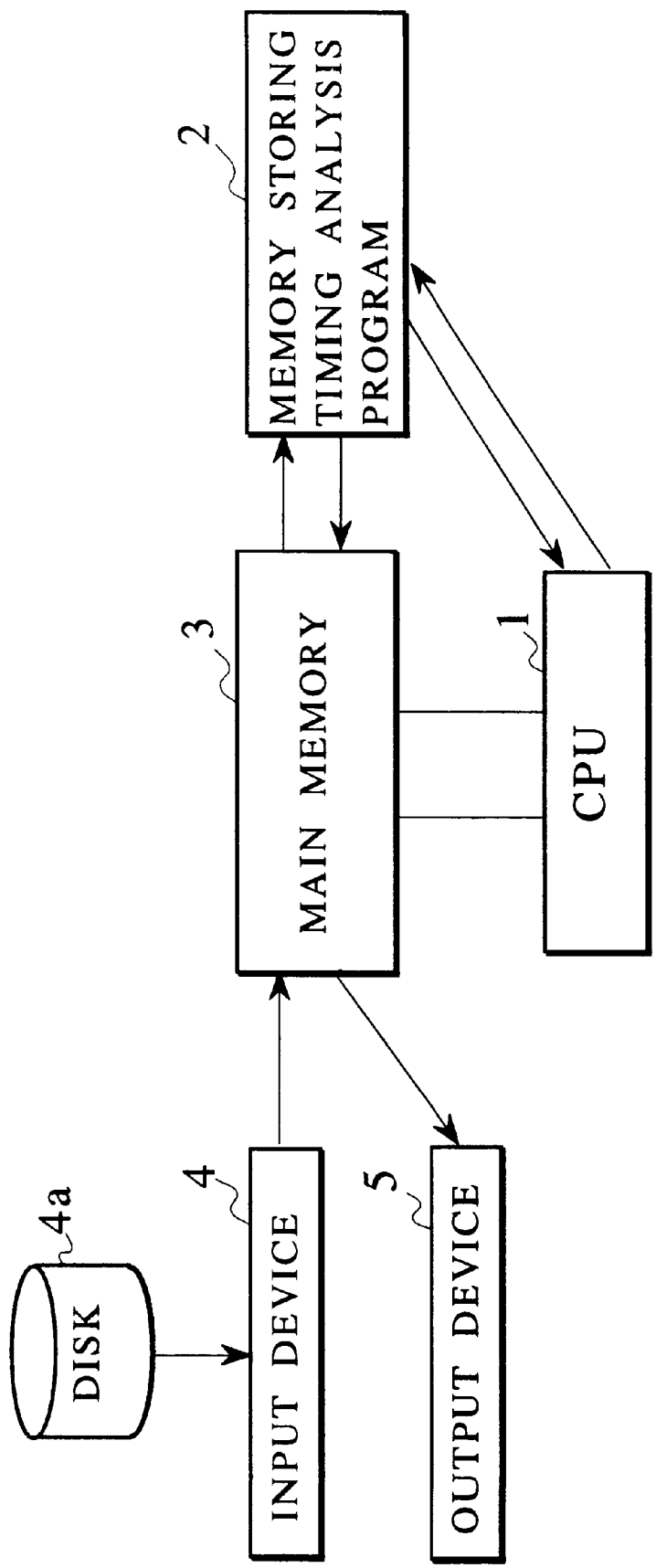
FIG. 4 is a block diagram showing a configuration of a timing analysis device according to the first embodiment of the present invention.

FIG. 4 is a block diagram showing a configuration of a timing analysis device according to the first embodiment of the present invention.

The timing analysis device 100 of the first embodiment comprises a central processing unit (CPU), a main memory 3 comprising Random Access Memories (RAMs), a disk 4a for storing information such as instruction data items of timing analysis and the like, a memory for storing a timing analysis program 2, an input device 4 for inputting information such as instructions of the timing analysis operation and the like, and an output device 5 for outputting information and results of the timing analysis process.

The CPU 1 executes the timing analysis program 2 including a path analysis program whose operation is shown by the flow chart in FIG. 5, and controls the timing analysis operation of the entire timing analysis device 100.

The net list stored in the disk 4a is transferred to the main memory 3 by the instruction inputted through the input device 4. The main memory 3 is used as a region where the net list is expanded and also used as a working region of the CPU 1. The result of the timing analysis operation for a designed circuit analyzed by the CPU 1 is provided to the output device 5 through the main memory 5. The output device 5 displays the result to operators.

In addition, the circuit pattern Con (i) that is described by using a structure description language (for example, such as SPICE) is stored in a specified field in the main memory 3. The circuit pattern Con (i) of the SPICE type satisfies various circuit conditions used for the pattern matching operation, which will be described later.

Here, the net list of the designed circuit used in the timing analysis method of the first embodiment is described based on the specified structure description language (for example, based on SPEICE). In the net list, the connection relationship of each terminal of an element is described and a static circuit network is expressed at a transistor design level.

Figures 5A, 5B:
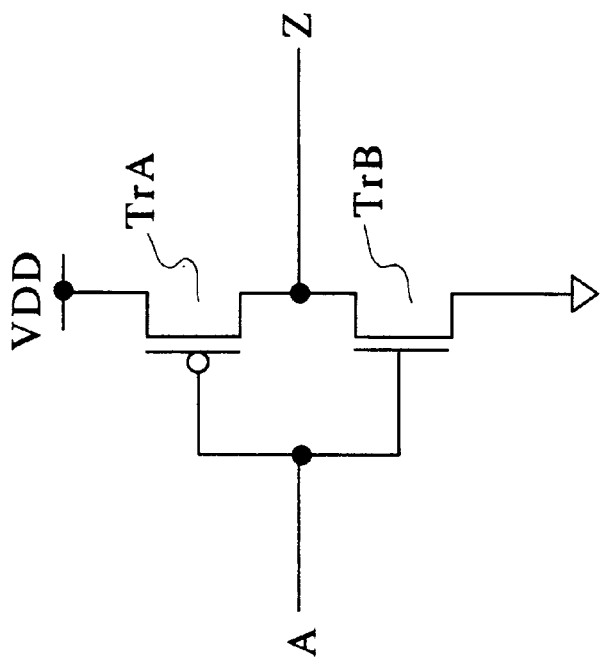
FIG. 5A is a circuit diagram of a CMOS inverter.
FIG. 5B is a diagram for explaining a SPICE type net list of the CMOS inverter circuit shown in FIG. 5A.

FIG. 5A is the circuit diagram of a CMOS inverter circuit comprising transistors TrA and TrB. FIG. 5B is a diagram for explaining a SPICE type net list of the CMOS inverter circuit shown in FIG. 5A. Thus, FIG. 5B shows the SPICE type net list of the CMOS inverter circuit shown in FIG. 5A.

The reference character MTrA shown in FIG. 5B designates a head description of information regarding the transistor element TrA and following reference characters Z, A, VDD, VDD indicate connection nodes of the drain, the gate, the source and the substrate of the transistor element TrA. The reference character PD=x1 indicates the surrounding length of the drain region, the reference character PS=y1 indicates the surrounding length of the source region, and the reference character AD=z1 indicates the area of the drain region in the transistor element TrA. In this case, the variables x1, y1, and z1 substitute actual values.

Similarly, the reference character MTrB shown in FIG. 5A designates a head description of information regarding the transistor element TrB and following reference characters Z, A, VSS, VSS indicate connection nodes of the drain, the gate, the source and the substrate of the transistor element TrB. The reference character PD=x2 indicates the surrounding length of the drain region, the reference character PS=y2 indicates the surrounding length of the source region, and the reference character AD=z2 indicates the area of the drain region in the transistor element TrB. In this case, the variables x2, y2, and z2 substitute actual values.

The operation of the timing analysis method executed by the timing analysis device 100 of the first embodiment will now be explained.

Figure 6:
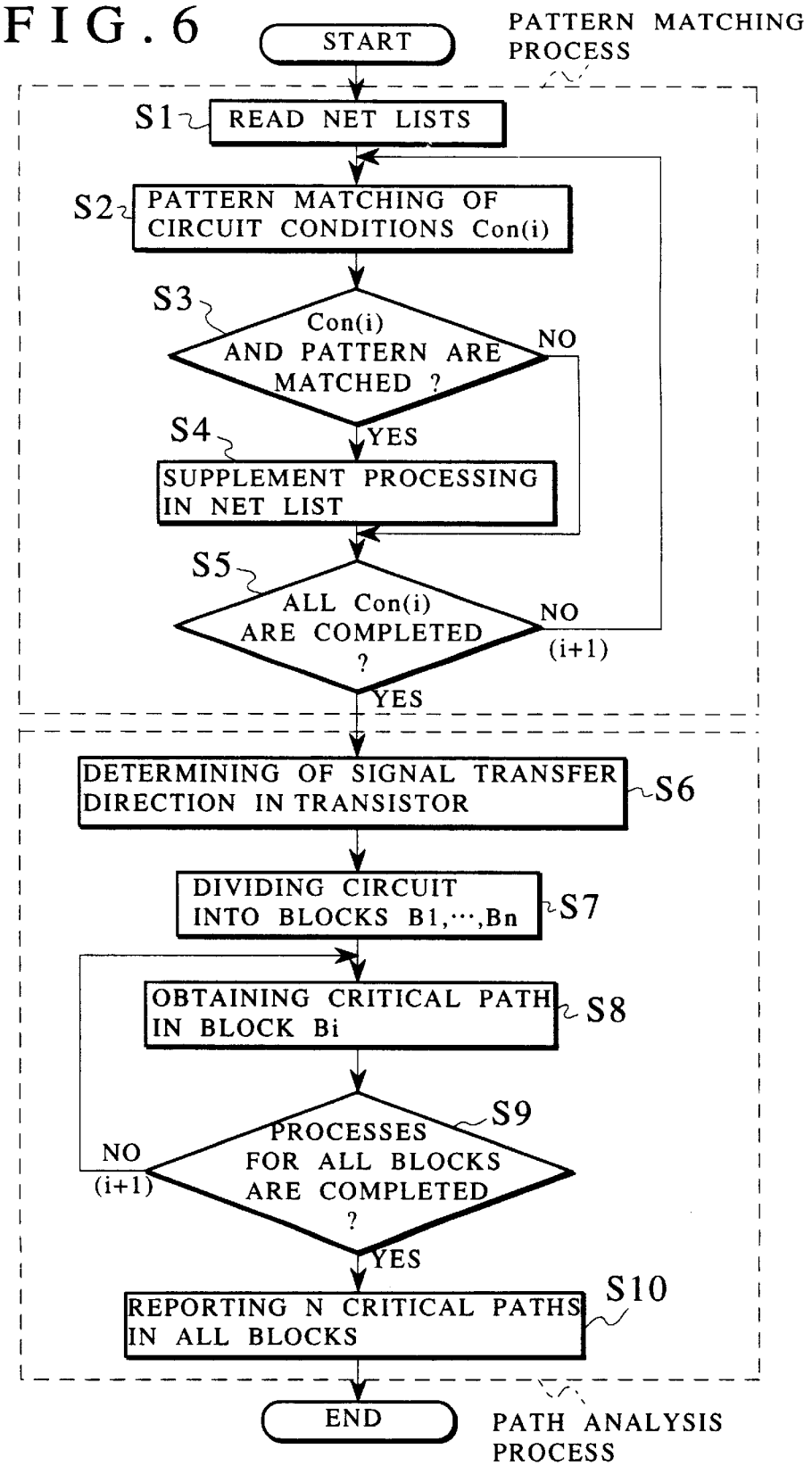
FIG. 6 is a flow chart showing a timing analysis method executed by a timing analysis device of the first embodiment shown in FIG. 4.

FIG. 6 is a flow chart showing the timing analysis method executed by a timing analysis device 100 of the first embodiment shown in FIG. 4.

First, an operator inputs instruction through the input device 4 in the timing analysis device 100. Then, the net list stored in the disk 4a in the timing analysis device 100 is read out and transferred to the main memory 3 based on the instruction (Step S1). In this case, the circuit pattern descriptions Con (i) have already been registered in the main memory 3 or another memory (not shown).

Next, the net list read out from the disk 4a and stored into the main memory 3 is compared with the circuit pattern Con (i) in pattern matching process (Step S2).

The operation to detect whether the net list is matched with the circuit pattern Con (i) or not is performed (Step S3). This operation is performed for all of the net lists.

Figure 1:
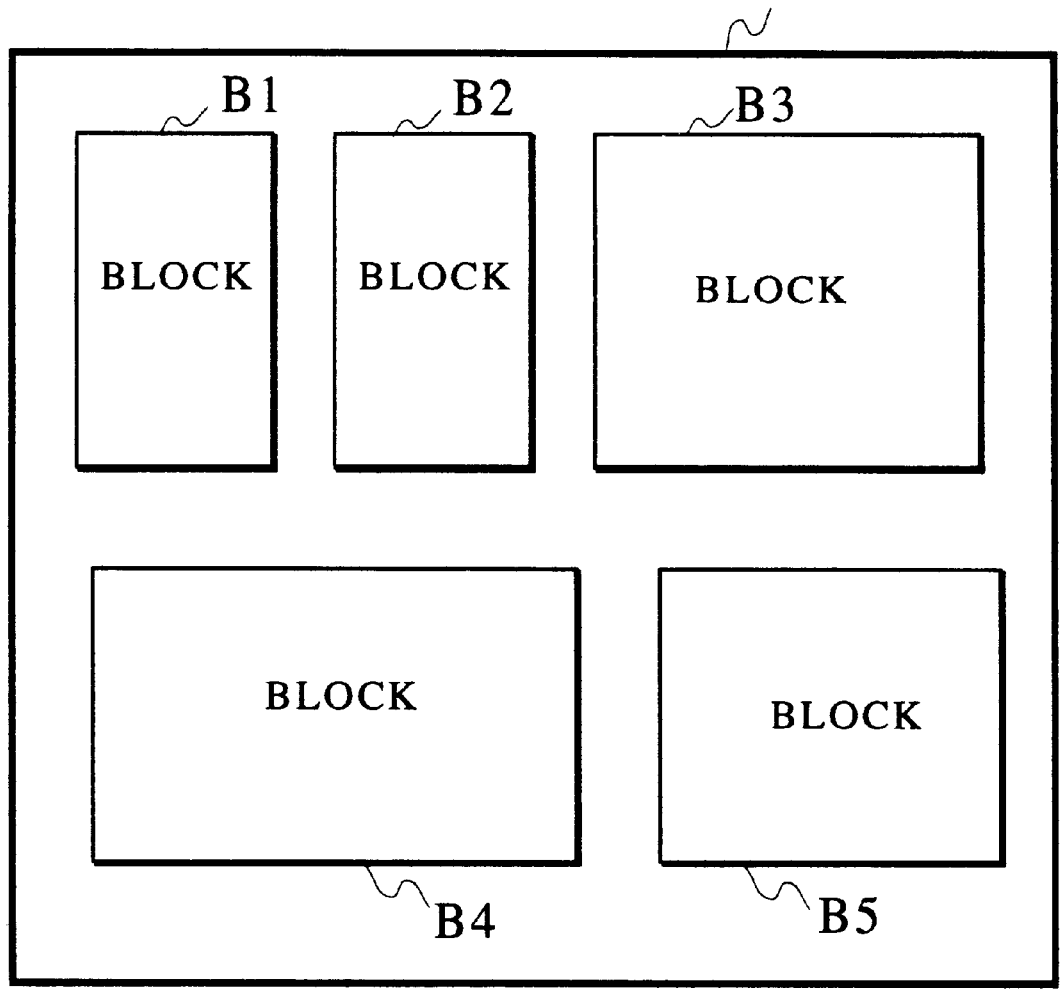
FIG. 1 is a diagram showing a microprocessor which is designed in a hierarchical structure having a plurality of functional blocks.
Figure 2:
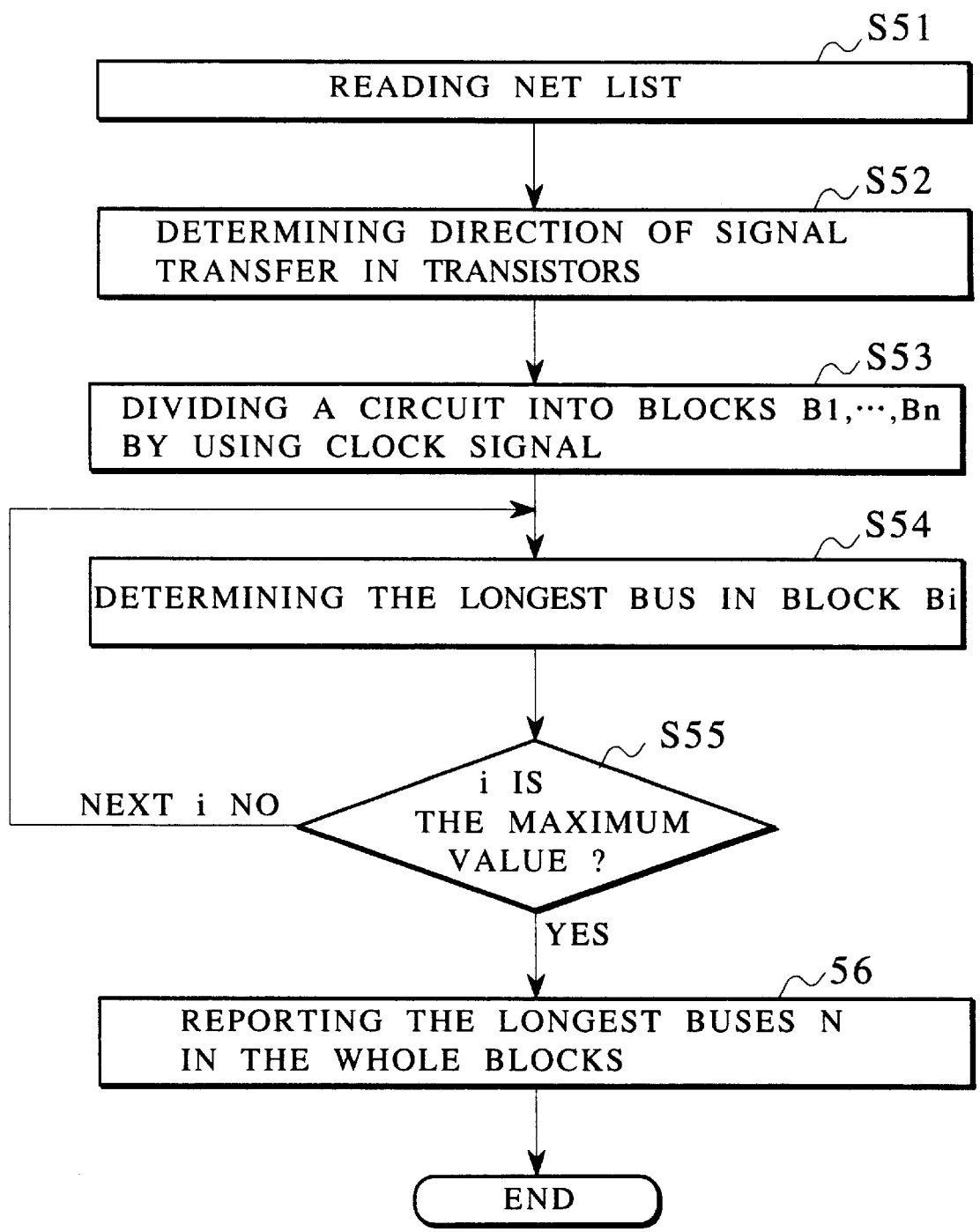
FIG. 2 is a flow chart showing the process of a path analysis by using a conventional timing analysis.
Figure 3:
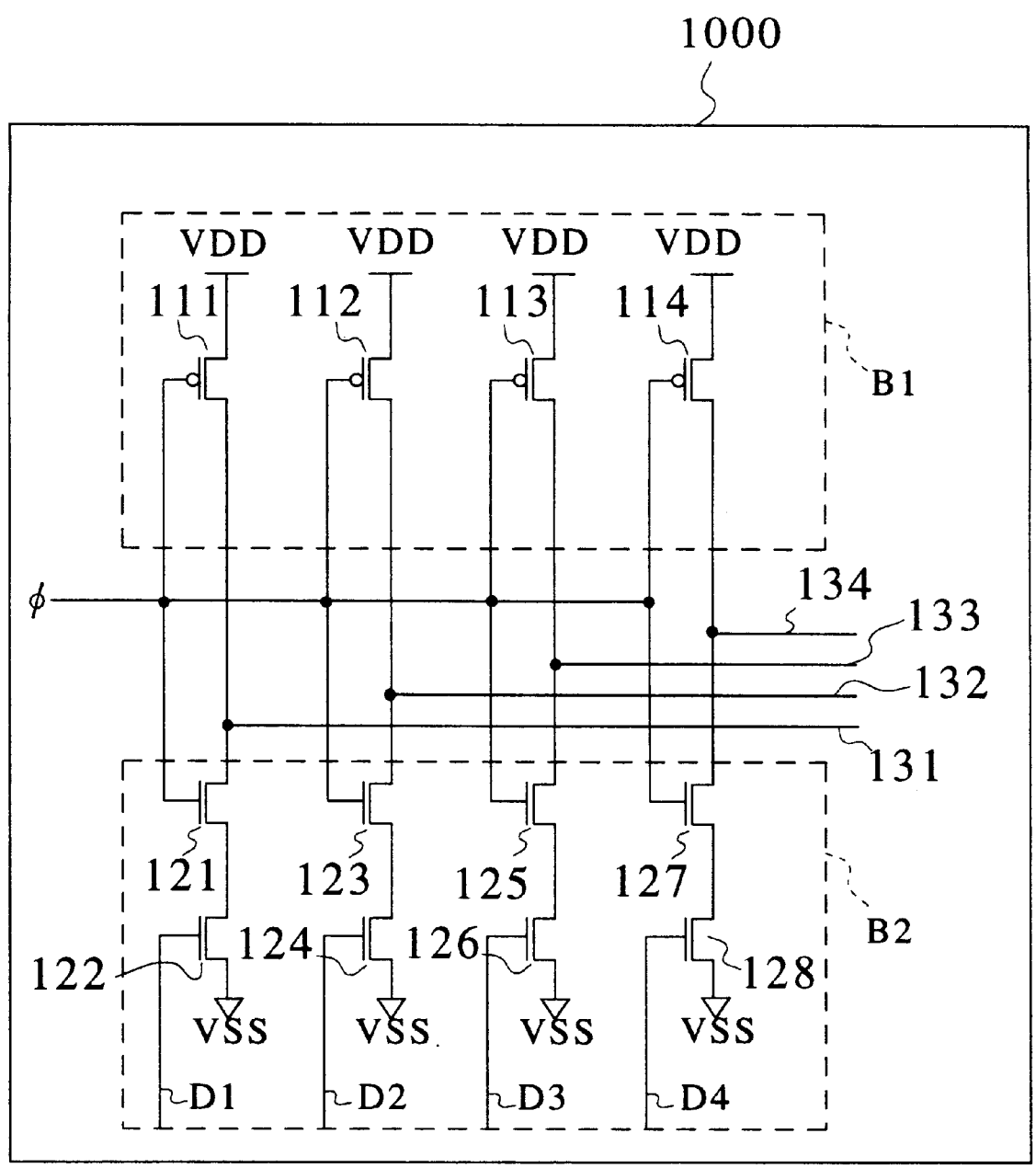
FIG. 3 is a diagram showing a semiconductor integrated circuit chip including pre-charge bus circuits.

For example, there is a circuit pattern, which is not analyzed only by using the hierarchy level of the block B2 shown in FIG. 3 where the entire microprocessor chip is analyzed in hierarchy, as one of the circuit patterns Con (i). That is, there are circuit patterns (N-MOS transistor 121 and the N-MOS transistor 122), (N-MOS transistor 123 and the N-MOS transistor 124), (N-MOS transistor 125 and the N-MOS transistor 126), and (N-MOS transistor 127 and the N-MOS transistor 128) as the circuit patterns that cannot be analyzed only by using the hierarchy level of the block B2.

In the judgment process at Step S3, when the pattern is matched with the circuit pattern Con (i), the operation flow shifts to Step S4. At Step S4, a compensation process of a net list corresponding to the matched circuit pattern Con (i) is performed. The circuit information to be supplemented is generated corresponding to the circuit pattern Con (i). For example, lacked circuit elements in the matched circuit pattern for the timing analysis operation are supplemented with other circuit blocks. Taking a specific example, the P-MOS transistors 111, 112, 113, and 114 in the block 1 shown in FIG. 3 are supplemented as the circuit information for the block B2.

On the other hand, no net list supplement operation is performed and the operation flow shifts to Step S5 when the circuit pattern Con (i) as the i-th circuit condition does not be matched with the net lists.

At Step S5, it is judged whether the circuit pattern Con (i) that is used in the current pattern matching process is the last circuit pattern or not. When it is the last circuit pattern, the operation flow shifts to Step S6 in order to perform the following path analysis process including Step S6 to Step S10 shown in FIG. 6. When a circuit pattern remains, the value (i) is incremented by 1, and the operation flow is returned to Step S2 and the operations Step S2 to Step S5 are repeated. Thus, the operations Step S2 to Step S5 are repeated by the number of the circuit patterns that have already been registered.

Thus, in the pattern matching process, the elements that will be required in the block level design process are supplemented automatically for the net lists that have been expanded in the main memory 3. This supplement process is one of the features of the present invention and will be executed in the pre-stage, namely before the path analysis process is executed.

In the path analysis process executed after the pattern matching process including the supplement process, the signal propagation direction in each transistor is determined (Step S6) in the net lists which have been supplemented in the pattern matching process. After step S6, the circuit is divided into a plurality of blocks B1, . . . , Bn based on the timing pulse (the clock signal) (Step S7). Each divided block has a functional feature based on the clock signals because the entire microprocessor circuit forming the chip is made up of sequential circuits and combination logic circuits connected between the sequential circuits, as shown in FIG. 4.

Figure 7:
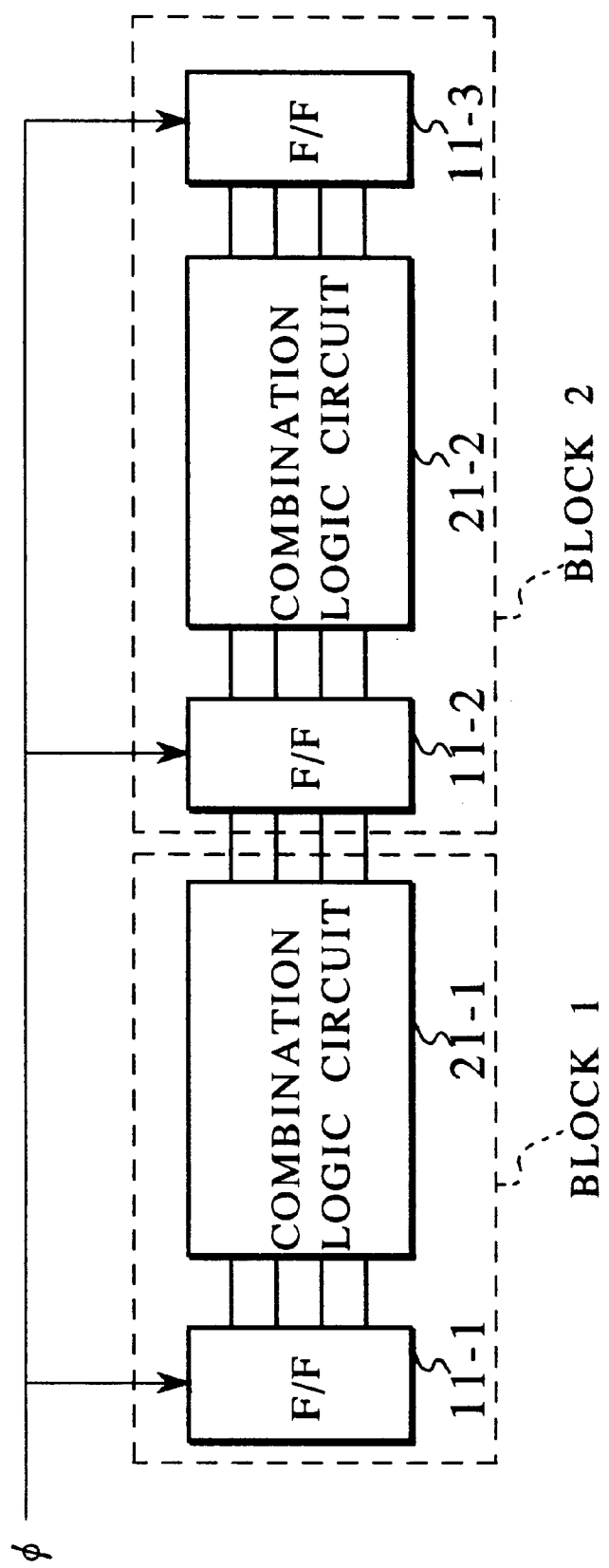
FIG. 7 is a diagram for explaining a block division process executed during the timing analysis shown in FIG. 6.

FIG. 7 is a diagram for explaining a block division process executed during the timing analysis shown in FIG. 6.

In the example shown in FIG. 7, the block 1 comprises the flip-flop (F/F) circuit 11-1 and the combination logic circuit 21-1. Similarly, the block 2 comprises the flip-flop (F/F) circuit 11-2, the combination logic circuit 21-2, and the flip-flop (F/F) circuit 11-3.

Next, the operation flow shifts to Step S7. In Step S7, the critical path in the divided block B1 is determined based on the signal transfer direction in each transistor that have already been determined at Step S6. In Step S9, it is checked whether the critical path in the entire blocks B1 to Bn is determined. When NO, the value (i) is incremented by 1, and then the process flow is returned to Step S8 in order to obtain the critical path in the following block. When YES, namely the critical path is determined through the entire blocks, the process flow shifts to Step S10. In Step S10, N critical paths (N is a positive number) are selected in the entire blocks B1 to Bn by operators. The selected N critical paths are reported to the operators through the output device 5. The series of the path analysis processes is completed. The operators (or users) observe the results obtained by the path analysis process in order to examine the validity of timing of the designed circuit.

In the timing analysis device 100 and the timing analysis method of the first embodiment, the pattern matching process including the supplement process is introduced. For example, the supplement of the elements to be required for the block design level is performed automatically in the pre-stage of the path analysis process. Thereby, it is possible to perform the timing analysis process in the hierarchical block level. The conventional timing analysis cannot execute the timing analysis in the block level.

Further, it can be achieved to eliminate operation errors caused by manual and the analysis operation time period can be decreased.

Second Embodiment

The timing analysis method of the second embodiment according to the present invention will now be explained.

In the timing analysis method of the second embodiment, the timing analysis method of the present invention is actually applied to the pre-charge bus circuit shown in FIG. 3.

When the conventional timing analysis method is applied to the pre-charge bus circuit shown in FIG. 3, it is difficult to perform the timing analysis correctly because the pair of the pre-charge bus circuit in the block B2 is not given to the set of the net lists. Thus, there is the drawback in the conventional timing analysis method. In order to eliminate the drawback of the conventional timing method, the timing analysis method of the present invention can supplement automatically circuit elements lacked in the block B2 for performing the timing analysis for the pre-charge bus circuit by adding the circuit elements in the block B1. The configuration of the timing analysis device of the second embodiment is the same as the configuration of the timing analysis device 100 of the first embodiment. However, the timing analysis program is different between the first embodiment and the second embodiment, specifically Step S24. The detailed operation of Step S24 will be explained later.

Next, the timing analysis operation of the second embodiment will be applied to the block B2.

Figure 8:
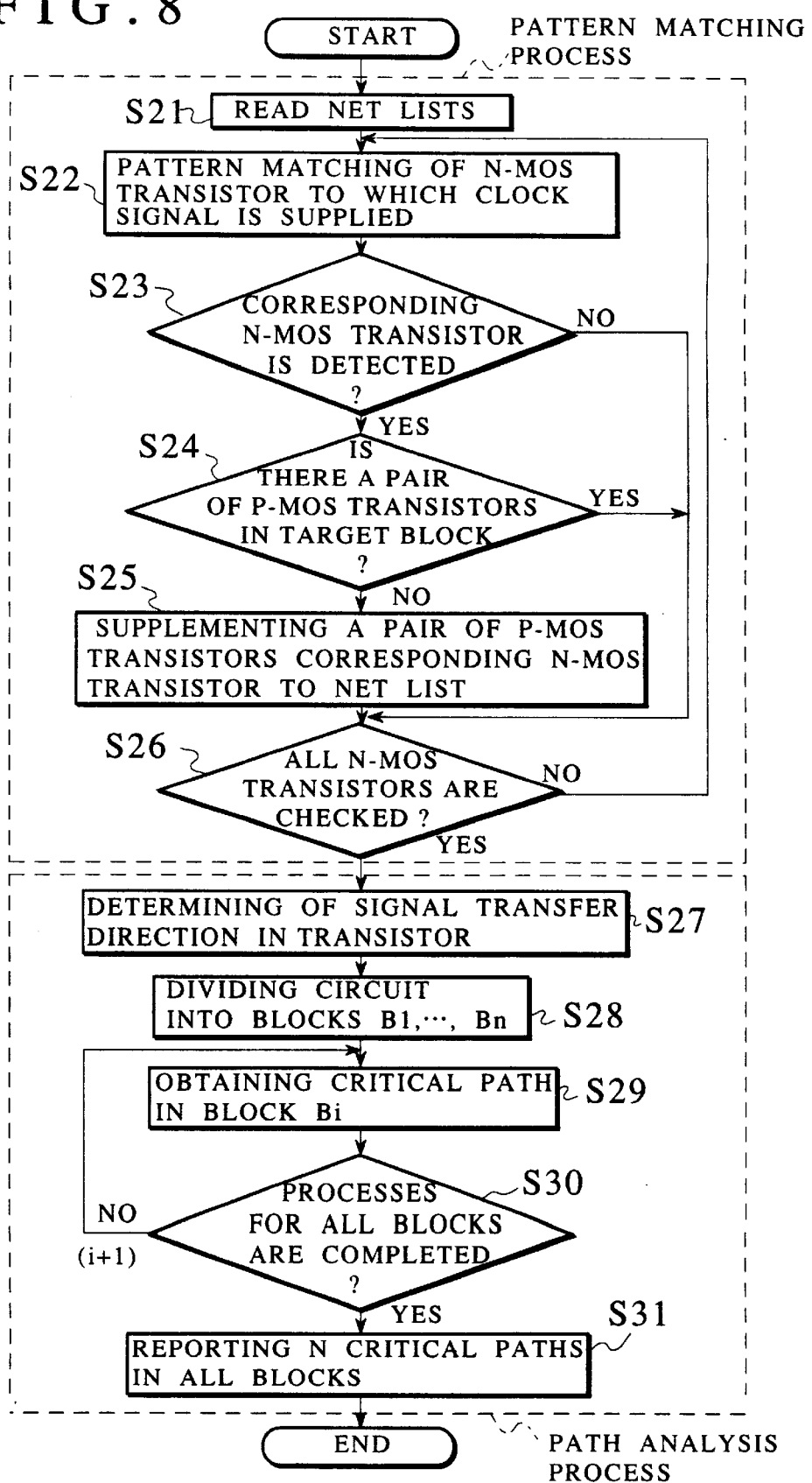
FIG. 8 is a flow chart showing a timing analysis method according to the second embodiment of the present invention.

FIG. 8 is a flow chart showing a timing analysis method according to the second embodiment of the present invention.

First, the operator indicates the start of the timing analysis operation for the block B2.

The net lists of the transistor levels regarding to the block B2 are read out from the disk 4a under the instruction of the operator. Then, the net lists are transferred to the main memory 3 (Step S21). For example, the circuit pattern in the structure description language having circuit conditions, that the clock signal is transferred to the gate of a N-MOS transistor, is registered in a memory in the timing analysis device, in advance. The circuit conditions are used for searching circuit patterns which will not be analyzed only by using the information of the block B2. These circuit patterns are searched in the net lists of the block B2 which have already been read into the main memory 3 by the pattern matching operation (Step S22).

In Step S22, the net lists that are read from the disk 4a and stored to the main memory 3 are compared with the registered circuit patterns which have been registered. In Step S23, it is detected that whether both are matched or not.

In the judgment process at Step S23, the N-MOS transistors 121, 123, 125, and 127 are detected as the matched patterns in the block B2. In Step S24, it is detected that there are corresponding P-MOS transistors (hereinafter referred to as the corresponding P-MOS transistors) in the block B2 which are connected to the common gate terminals of the detected N-MOS transistors 121, 123, 125, and 127.

In the process at Step S24, when the detection result is NO, namely there are no P-MOS transistors corresponding to the N-MOS transistors 121, 123, 125, and 127, the process flow shifts to Step S25. In Step S25, the structure descriptions of the P-MOS transistors 111, 112, 113, and 114 in the block B1 are supplemented for the net lists of the block B2, that have been expanded in the main memory 3, as information of lacked circuit parts. After this process, the process flow shifts to Step S26.

On the other hand, when the detection result at Step S23 is NO, namely when no corresponding N-MOS transistors are detected, the process flows shifts to Step S26, does not shift to Step S24 or Step S25.

On the other hand, when the detection result is YES at Step S24, namely there are corresponding P-MOS transistors in the block B2, the process flows shifts to Step S26, does not shift to Step S25.

As described above, in the timing analysis of the second embodiment, lacked circuit parts such as the N-MOS transistors 121, 123, 125, and 127 that are parts of the pre-charge bus circuit shown in FIG. 3 are detected in the net lists of the block B2 by using the circuit condition indicating that the clock signal is supplied to gate terminals of N-MOS transistors.

Figure 9:
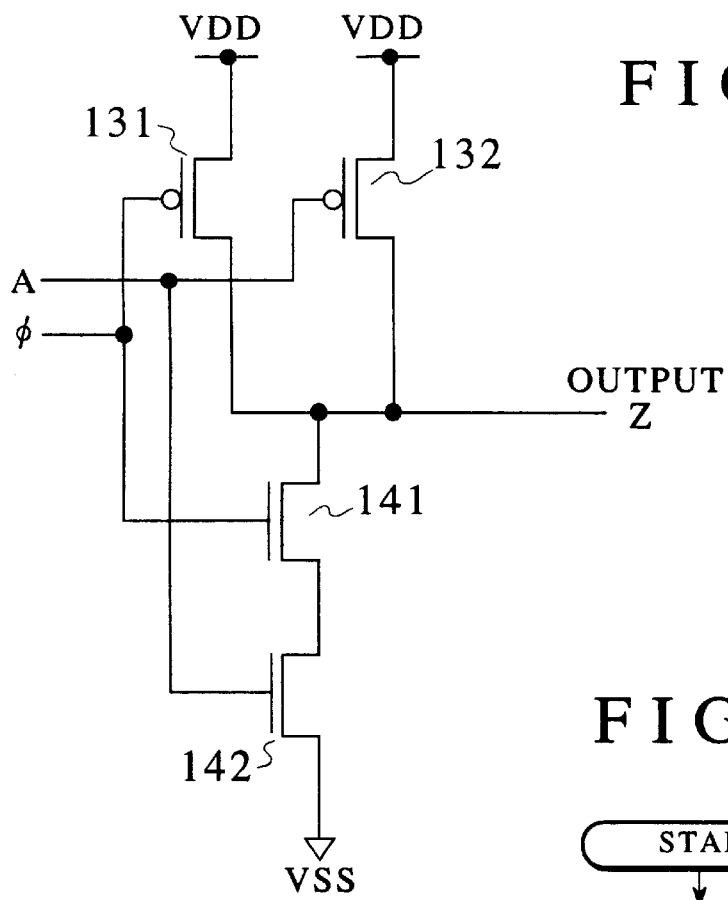
FIG. 9 is a circuit diagram showing a 2-input NAND gate circuit which is used in the timing analysis methods of the first and second embodiments of the present invention.

FIG. 9 is a circuit diagram showing a 2-input NAND gate circuit which is used in the timing analysis methods of the first and second embodiments of the present invention.

However, there is a possibility to cause the case that the N-MOS transistors detected by using the circuit condition described above have a N-MOS transistor in the 2-input NAND gate circuit shown in FIG. 9. This case will now be explained in detail. As shown in FIG. 9, the 2-input NAND gate circuit comprises the P-MOS transistors 131 and 133 and the N-MOS transistors 141 and 142 connected between the power source VDD and the ground source VSS. In actual, the clock signals is supplied to both gates of the N-MOS transistor 141 and the P-MOS transistor 131. Input data is provided to both the gate terminals of the N-MOS transistor 142 and the P-MOS transistor 132. The output node is the connection point between the P-MOS transistors 131 and 132 and the N-MOS transistor 141. The output data item Z is outputted through the output node.

In the 2-input NAND gate circuit shown in FIG. 9, the N-MOS transistor whose gate terminal receives the clock signal is the N-MOS transistor 141. The corresponding P-MOS transistor corresponding to the N-MOS transistor 141 is the P-MOS transistor 131.

When there is no Step S24 in FIG. 8, the N-MOS transistor 141 in the 2-input NAND gate circuit shown in FIG. 9 is detected as the N-MOS transistor detected at Step S22 by using the circuit condition indicating that the clock signal is supplied to the gate terminal of the N-MOS transistor. In this case, the operation at Step 25 will cause an error supplement operation.

In order to eliminate occurrence of this error supplement operation, Step S24 is included in the timing analysis method of the second embodiment. That is, when there is a corresponding P-MOS transistor in a target block to be analyzed, Step S25 performing the net list supplement operation is not executed or skipped. This causes the pattern matching process to be performed correctly.

In the pattern matching process, the N-MOS transistors 121, 123, 125, and 127 are detected. At Step S26, it is checked that whether all of the N-MOS transistors in the block B2 having the circuit condition indicating that the clock signal is supplied to the gate terminal of a N-MOS transistor are detected or not. When YES, the process flow shifts to Step S27 in the path analysis process. When NO, namely all of the N-MOS transistors in the block B2 having the circuit condition are detected, the process flow shifts to Step S22. In this case, Step S22 to S26 are repeated until all of the N-MOS transistors in the block B2 having the circuit condition are detected. The path analysis process in the second embodiment shown in FIG. 8 is same as that of the first embodiment shown in FIG. 6. That is the processes of Step S27 to S31 in the path analysis process shown in FIG. 8 corresponds to the processes of Step S6 to S10 in the path analysis process shown in FIG. 6.

As described above in detail, the timing analysis method of the second embodiment has the same effect of the timing analysis method of the first embodiment.

The pattern matching process described above that is introduced into the timing analysis method of the first and second embodiment is the feature of the present invention.

A special processing to be executed by using the pattern matching process in the timing analysis method will now be explained by comparing it to the conventional pattern matching method.

In the special processing to be executed by using the conventional pattern matching method, input information is compared with a given pattern description. When both are equal, (1) the same patterns, that agreed with each other, in the input information are processed by using another rule, or (2) the same pattern is replaced with other information. Then the operation process is returned from the special process to the normal process.

Figure 10:
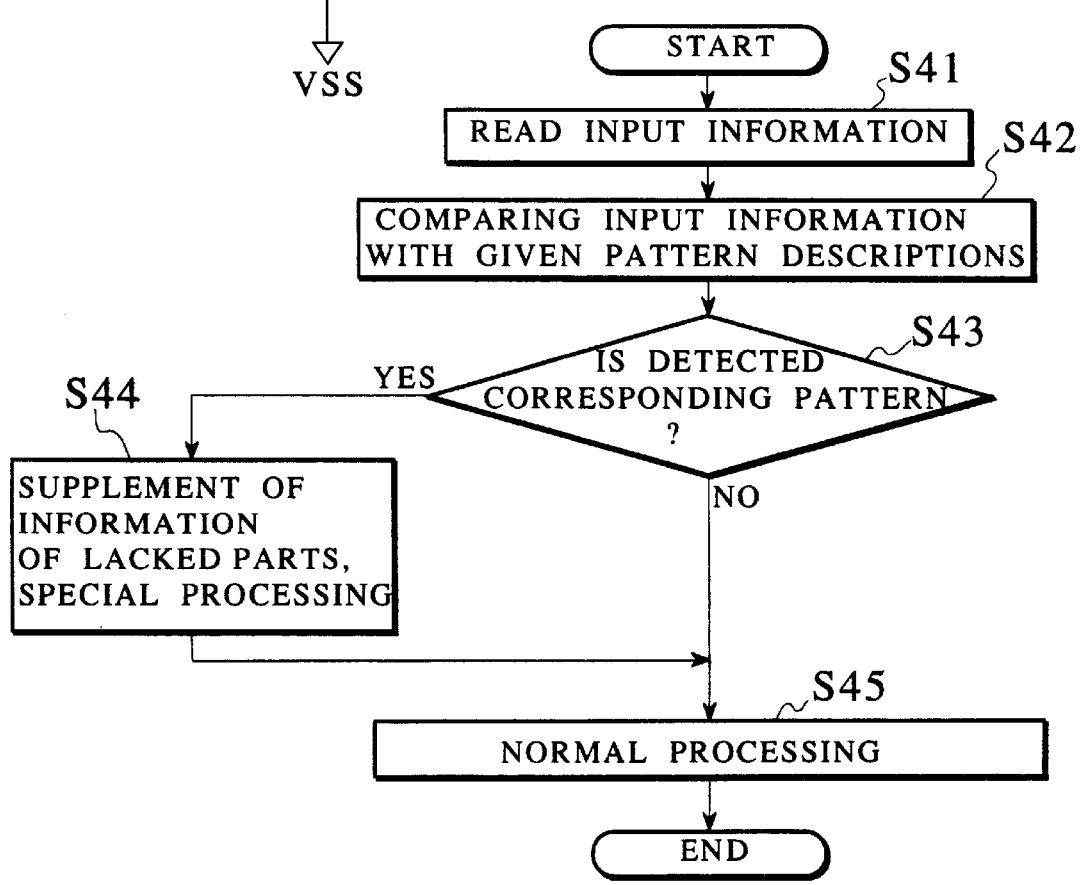
FIG. 10 is a flow chart for explaining a pattern matching method executed by using the first and second embodiments of the present invention.

On the other hand, as shown in FIG. 10 that is a flow chart for explaining the pattern matching method executed by using the first and second embodiments of the present invention, in the pattern matching method of the first and second embodiments, at first, the input information is read out (Step S41), and then the input information is compared with the pattern descriptions (Step S42), it is detected whether the input information corresponding to the pattern descriptions is detected or not (Step S43). When it is detected, the supplement process to the input information is performed. In the supplement process, the information regarding the pattern descriptions which have been defined in advance is supplemented as lacked information (Step S44). After this, the process flow is returned to the normal process (Step S45).

On the other hand, when no corresponding information is detected, the process flow is returned to the normal process without any special processing (Step S45).

As described above in detail, according to the pattern matching method of the present invention, input information is matched with predetermined patterns after the input information is read out, and net lists regarding the predetermined patterns to the input information are supplemented only when there is a data item in the input information that matches with the predetermined patterns. Thereby, the pattern matching process based on the pattern matching method can be executed easily and the accuracy of the timing analysis process can be increased.

In addition, according to the timing analysis method of the present invention, the connection information is matched with circuit patterns that have been registered in advance after the reading of the connection information of an electrical circuit as a target circuit. Then, the connection information supplement process for supplementing vertically circuit connection information regarding the registered circuit pattern matched with the connection information of the electrical circuit is executed when there is the information in the connection information matched with the registered circuit pattern. Then, the timing analysis process for the circuit connection information is performed after the completion of the connection information supplement process. Thereby, it is possible to perform accurately the timing analysis. Further, the supplement process of data items of circuit connection information is executed automatically, not manually and it is possible to eliminate the occurrence of the error in the supplement process and to decrease the analysis time.

Furthermore, according to the timing analysis method of the present invention, the circuit patterns are circuit patterns that are not analyzed in a predetermined hierarchy by the timing analysis process and the circuit connection information supplemented by the connection information supplement process are connection information of a circuit in a hierarchy other than the predetermined hierarchy. Accordingly, it is possible to execute the timing analysis process in the block design level by using the timing analysis method of the present invention when the timing analysis process is performed in a hierarchy (it is difficult to perform the timing analysis in hierarchy by using a conventional timing analysis method).

Moreover, according to the present invention, the timing analysis method further comprises the step of detecting whether or not the connection information matched with the registered circuit patterns is connection information that is not the target for the connection information supplement process and is in the predetermined hierarchy, wherein the pattern matching method performs the timing analysis process without executing the connection information supplement process when a detection indicated. Accordingly, it is possible to supplement accurate circuit connection information corresponding to the timing analysis in the connection information supplement process.

In addition, according to the timing analysis method of the present invention, the registered circuit patterns are circuit patterns regarding pre-charge bus circuits and circuit connection information are supplemented so that a N-MOS transistor and a P-MOS transistor are grouped into one pair by a same phase clock signal in the connection information supplement process. Accordingly, for example, in a circuit part of a pair of the N-MOS transistor and the P-MOS transistor in the pre-charge bus circuit performed by the same-phase clock signal, the circuit connection information lacked as the pre-charge bus circuit can be automatically and vertically supplemented in transistor design level when the P-MOS transistor and the N-MOS transistor are in different blocks.

Furthermore, according to the present invention, the timing analysis device comprises a memory for storing connection information of an electrical circuit, pattern matching means for performing a matching process to match the connection information stored in the memory with predetermined circuit patterns, connection information supplement means for supplementing circuit connection information regarding a circuit pattern matched in the predetermined circuit patterns to the connection information stored in the memory when the connection information stored in the memory is matched with the predetermined circuit patterns, and timing analysis means for performing a timing analysis process for the connection information stored in the memory which has been supplemented by the connection information supplement means. Accordingly, it is of course possible to have the same effects of the pattern matching method and the timing analysis method described above. In general, it is difficult to obtain the timing accuracy of a timing analysis required in deep sub-micron era (in which the process technique has the gate width of 0.5 micron or below) in the gate design level for a high performance microprocessor. In addition, it is difficult for a designer to directly obtain the input vector to activate a critical path for a complicated circuit by using a dynamic timing analysis device to require the input vector.

For this reason, it has been required to perform the static timing analysis at the transistor design level. By means of the timing analysis device according to the present invention, it is possible to increase the accuracy of the timing analysis.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A pattern matching method comprising the steps of:
storing circuit patterns which describe connection relationship of each terminal of elements by using structure description language;
reading a netlist of a designed circuit which describes connection relationship of each terminal of elements by using structure description language;
matching the netlist with the circuit patterns;
detecting whether the netlist is matched with the circuit patterns or not;
generating circuit information to be supplemented corresponding to the matched circuit pattern; and
supplementing net lists based on the circuit information so that lacked circuit elements in the matched circuit pattern are supplemented with the designed circuit.

2. A timing analysis method comprising the steps of:
storing circuit patterns which describe connection relationship of each terminal of elements by using structure description language;
reading a netlist of a designed circuit which describes connection relationship of each terminal of elements by using structure description language;
matching the netlist with circuit patterns;
detecting whether the netlist is matched with the circuit patterns or not;
generating circuit information to be supplemented corresponding to the matched circuit pattern
supplementing a netlist based on the circuit information so that lacked circuit; elements in the matched circuit pattern are supplemented with the designed circuit; and
performing a timing analysis process for the connection information after completion of the connection information supplement process.

3. A timing analysis method as claimed in claim 2, wherein the circuit patterns are circuit patterns that are unable to be analyzed by only using predetermined hierarchy by the timing analysis process and the circuit connection information supplemented by the connection information supplement process are connection information of a circuit in a hierarchy other than the predetermined hierarchy.

4. A timing analysis method as claimed in claim 3, the detecting step further comprising the steps of detecting whether or not the connection information matched with the registered circuit patterns is connection information that is not a target for the connection information supplement process and is in the predetermined hierarchy, wherein the pattern matching method performs the timing analysis process without executing the connection information supplement process when detection occurs.

5. A timing analysis method as claimed in claim 2, wherein the registered circuit patterns are circuit patterns of pre-charge bus circuits and circuit connection information is supplemented so that a N-MOS transistor and a P-MOS transistor are grouped into one pair by a same phase clock signal in the connection information supplement process.

6. A timing analysis method as claimed in claim 3, wherein the registered circuit patterns are circuit patterns of pre-charge bus circuits and circuit connection information is supplemented so that a N-MOS transistor and a P-MOS transistor are grouped into one pair by a same phase clock signal in the connection information supplement process.

7. A timing analysis device comprising:

a memory for storing connection information of an electrical circuit;

pattern matching means for performing a matching process to match the connection information stored in the memory with predetermined circuit patterns;

connection information supplement means for supplementing circuit connection information of a circuit pattern matched in the predetermined circuit patterns to the connection information stored in the memory when the connection information stored in the memory is matched with the predetermined circuit patterns; and timing analysis means for performing a timing analysis process for the connection information stored in the memory which has been supplemented by the connection information supplement means.

8. A timing analysis method comprising the steps of:

reading a first net list which contains circuit connection information of a semiconductor integrated circuit;

matching the circuit connection information with predetermined circuit patterns that are unable to be timing analyzed by only using the circuit patterns;

determining whether or not the circuit connection information is matched with the predetermined circuit patterns; and supplementing second net list corresponding to the matched circuit pattern to the first net list when the circuit connection information is matched with predetermined circuit patterns.

9. A timing analysis method as claimed in claim 8, further comprising the steps of:

performing a timing analysis process for the first net list after completion of supplement process.

10. A timing analysis device comprising:

a memory for storing a first net list that contains circuit connection information of a semiconductor integrated circuit;

a pattern matching means for matching the first net list with predetermined circuit patterns which are unable to be timing analyzed by only using the circuit patterns;

determining means for determining whether or not the circuit connection information is matched with the predetermined circuit patterns; and supplementing means for supplementing a second net list corresponding to the matched circuit pattern to the first net list when the circuit connection information is matched with predetermined circuit patterns.

* * * * *